(12) United States Patent
Tran et al.

(10) Patent No.: US 12,394,451 B2
(45) Date of Patent: Aug. 19, 2025

(54) STRUCTURE AND METHOD TO GROUND REFERENCE VOLTAGE GENERATOR

(71) Applicant: GlobalFoundries U.S. Inc., Malta, NY (US)

(72) Inventors: Dzung T. Tran, Austin, TX (US); Navneet K. Jain, Milpitas, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 317 days.

(21) Appl. No.: 18/166,544

(22) Filed: Feb. 9, 2023

(65) Prior Publication Data

US 2024/0274161 A1    Aug. 15, 2024

(51) Int. Cl.
*G11C 5/14* (2006.01)
*G01R 19/165* (2006.01)

(52) U.S. Cl.
CPC ........ *G11C 5/147* (2013.01); *G01R 19/16519* (2013.01)

(58) Field of Classification Search
CPC .... H03K 17/161; H03K 17/302; H03K 17/56; H03K 17/567; H03K 17/60; H03K 17/687; H03K 17/6871; H03K 17/16; H03K 17/30; H03K 17/601; H03K 17/64; H03K 17/691; H03K 17/731; H03K 17/10; H03K 17/102; H03K 17/107; H03K 17/12; H03K 17/122; H03K 17/127; H03K 19/00346; H03K 19/00353; H03K 19/00361; H03K 19/003; H03K 19/00307; H03K 19/00315; H04L 25/026; G11B 5/02; G11B 5/022

See application file for complete search history.

(56) References Cited

U.S. PATENT DOCUMENTS

| | | |
|---|---|---|
| 5,572,147 A | 11/1996 | Huang et al. |
| 5,898,324 A | 4/1999 | Yanagisawa |
| 2008/0111609 A1* | 5/2008 | Shen ................. H03K 3/35613 327/333 |
| 2019/0305778 A1* | 10/2019 | Chen .................. H03K 17/6872 |

* cited by examiner

*Primary Examiner* — Bryan R Perez
(74) *Attorney, Agent, or Firm* — David Cain; Hoffman Warnick LLC

(57) ABSTRACT

Embodiments of the disclosure provide a structure and method to ground a reference voltage generator based on a detected supply voltage. A circuit structure according to the disclosure includes a pass gate. The pass gate includes a pair of transistors each coupled to an input signal. One of the pair of transistors of the pass gate includes a gate coupled to a static reference voltage. An inverter couples an output from the pass gate to a device node. The inverter includes a drain terminal, a gate terminal, and a back-gate terminal coupled to ground.

19 Claims, 5 Drawing Sheets

STRUCTURE AND METHOD TO GROUND REFERENCE VOLTAGE GENERATOR

BACKGROUND

1. Technical Field

The present disclosure provides a circuit structure and related method to ground a reference voltage generator.

2. Background Art

Many electronic devices use general purpose input/output (GPIO) pins, in combination with a power supply and reference voltage generator, to transmit signals at predetermined voltage levels to components and sub-circuits of a device. A power supply typically operates at a fixed high voltage level, whereas the reference voltage generator typically outputs a fixed voltage level that is less than the power supply voltage but greater than ground (e.g., the reference voltage may be one half of the power supply voltage's magnitude). Various GPIO pins may allow signals at voltage levels other than the power supply voltage and the reference voltage to be transmitted to components in need of such voltage levels. As a device powers on or off, however, the various GPIO pins may receive less than the specified power supply voltage before the device is fully powered on or off. In situations where power sequencing is required (i.e., one component or portion of a device must turn on or off before another), the reduced voltage from the power supply may create floating voltages within the device even after the power supply is fully off. These floating voltages being present after a device powers down may negatively affect various operations of a device after it is powered back on.

SUMMARY

The illustrative aspects of the present disclosure are designed to solve the problems herein described and/or other problems not discussed.

Embodiments of the disclosure provide a circuit structure including: a pass gate including a pair of transistors each coupled to an input signal, wherein one of the pair of transistors of the pass gate includes a gate coupled to a static reference voltage; and an inverter coupling an output from the pass gate to a device node, wherein the inverter includes a drain terminal, a gate terminal, and a back-gate terminal coupled to ground.

Other embodiments of the disclosure provide a circuit structure including: a power supply configured to output a supply voltage and a core voltage of less magnitude than the supply voltage; a reference voltage generator coupled to a power supply and configured to output a reference voltage at an output terminal; a transistor array coupled to the power supply and the reference voltage generator, wherein the transistor array includes: a set of LDMOS transistors each having a source/drain (S/D) terminal coupled to the supply voltage; and an inverter having a gate terminal coupled to the supply voltage through the set of LDMOS transistors, wherein a threshold voltage of the inverter corresponds to a target voltage, wherein the transistor array couples the output terminal of the reference voltage generator to ground in response to detecting the supply voltage as less than the target voltage, wherein the core voltage drives operation of the transistor array; and a device node coupled to the output terminal of the reference voltage generator through the transistor array.

Additional embodiments of the disclosure provide a method including: transmitting an input signal to a pass gate including a pair of transistors, wherein one of the pair of transistors of the pass gate is coupled to a static reference voltage; and transmitting an output from the pair of transistors to an inverter including a drain terminal, a gate terminal, and a back-gate terminal coupled to ground, wherein the inverter sets the output from the pair of transistors to ground in response to detecting the input signal as less than a target voltage.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
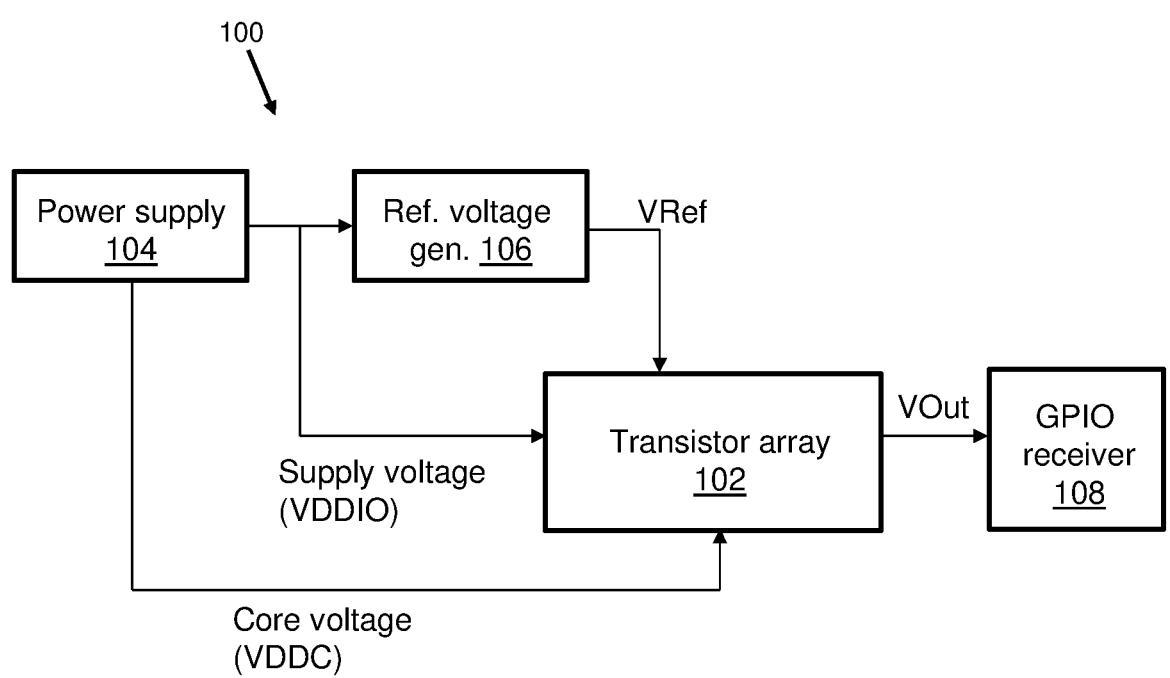
FIG. 1 shows a schematic diagram of a circuit structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a structure and method to electrically ground a reference voltage generator (i.e., set its output to zero volts). A circuit structure according to the disclosure may include a pass gate in the form of two transistors, each coupled to an input signal. One of the pair of transistors of the pass gate includes a gate coupled to a static reference voltage. An inverter couples an output from the pass gate to a device node. The inverter includes a drain, gate, and back-gate each coupled to ground. In this configuration, the transistor array may ground the reference voltage in situations where the target voltage is not available. Grounding the reference voltage will prevent a floating voltage from occurring within the device node. The pass gate transistors will increase or reduce a voltage of the input signal to prevent applying a breakdown voltage of the inverter. In cases where the inverter detects the target voltage being available from the power supply, the reference voltage is then transmitted to the device node to enable an intended operation of the device. Embodiments of the disclosure may thus enable power sequencing, i.e., ensuring that the higher magnitude target voltage is available before allowing the reference voltage to be transmitted to operational components of a device.

Turning to FIG. 1, a circuit structure 100 (simply "structure" hereafter) is shown according to embodiments of the disclosure. Within structure 100, a transistor array 102 may have several electrical inputs coupled thereto (e.g., a supply voltage, a core voltage, and a reference voltage as discussed herein). Transistor array 102 may have an output voltage ("Vout") transmitted to other components as discussed herein, and the magnitude of output voltage Vout may be determined based on the combination of input voltages provided to transistor array 102. Specifically, transistor array 102 is operable to detect whether a supply voltage (VDDIO) transmitted from a power supply 104 is at least equal to a target value (e.g., a maximum voltage level such as five volts (V)). Transistor array 102, upon detecting that the supply voltage is at least equal to the target value, couples the incoming reference voltage VRef from a reference voltage generator 106 to another component (e.g., an internal node of a general purpose input/output (GPIO) receiver 108)). In cases where the supply voltage from power supply 104 is less than the target value, transistor array 102 will couple the incoming reference voltage VRef to ground (i.e., a zero voltage) such that the output voltage VOut is also set to ground.

Power supply 104 of structure 100 may be embodied as, e.g., any currently or later developed electrical power source such as a battery, electrical grid connection, etc., for providing a set voltage level. Power supply 104 may include circuitry and/or other components for outputting multiple voltage levels, including a supply voltage that reflects the maximum voltage of power supply 104 (e.g., approximately 5.0 V) and a core voltage (e.g., approximately 0.8 V) that is significantly lower than the supply voltage and suitable to electrically drive and/or otherwise operate microelectronic components within structure 100. Power supply 104 may include a set of resistors, voltage dividers, etc., to provide the supply voltage and core voltage at distinct output terminals thereof. Embodiments of transistor array 102 may be coupled to the supply voltage and core voltage from power supply 104. The supply voltage is provided to transistor array 102 an input for comparison with a target voltage as discussed herein, whereas the core voltage from power supply 104 electrically drives the operation of various transistors within transistor array 102. Reference voltage generator 106 may use the supply voltage from power supply 104 to generate a reference voltage, e.g., a predetermined fraction of the supply voltage suitable for various signal processing and/or electrical functions to be implemented on a device.

The device function(s) of the reference voltage generated in reference voltage generator 106 require both the supply voltage and the reference voltage to be of a target magnitude, e.g., to prevent floating voltages within the device structure form unintentionally causing current flow through inactive components. Embodiments of transistor array 102 thus detect whether supply voltage has reached a target value before the reference voltage is coupled to one or more active components through a GPIO receiver 108. As discussed herein, transistor array 102 will couple the output from reference voltage generator 106 to ground unless the supply voltage is equal to a predetermined target voltage.

Figure 2:
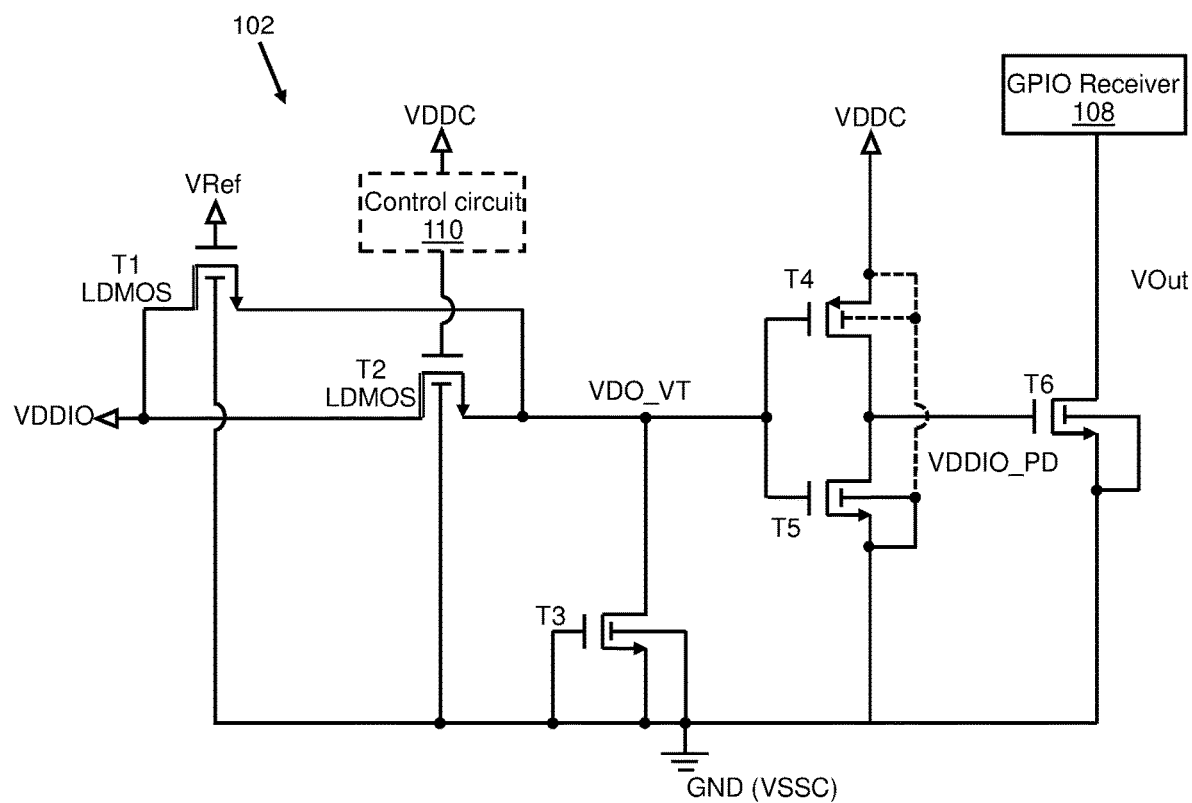
FIG. 2 shows an expanded schematic diagram of the circuit structure and transistor array with interconnections according to embodiments of the disclosure.

FIG. 2 provides a schematic diagram of various components of transistor array 102, including seven transistors T1, T2, T3, T4, T5, and T6 for implementing various functions. Transistors T1, T2 may provide a "pass gate" configuration for using two different gate voltages (i.e., reference voltage VRef and core voltage VDDC) to convert the supply voltage VDDIO into a comparison voltage (VDO_VT) indicating whether supply voltage VDDIO has reached its target value. Transistors T1, T2 may be implemented as laterally diffused metal oxide semiconductor field effect transistors (LDMOS-FETs or simply "LDMOS transistors" hereafter), which may be operationally similar or identical to other types of transistors (e.g., metal oxide semiconductor (MOS) transistors).

LDMOS transistors are widely used in amplifiers, such as radio frequency (RF) amplifiers, microwave power amplifiers, etc. because of their low on-resistance and because, in general, they have a relatively high blocking voltage (also referred to in the art as the drain-to-source breakdown voltage). LDMOS transistors are distinguished from other transistors in circuit schematics by including a double line at their drain terminal, e.g., as indicated in FIG. 2 (also FIG. 4 discussed herein), to indicate the structural asymmetry of the transistor and longer drain length provided by a lightly doped "drift region." LDMOS transistors may be formed on P-type and P+-type (i.e., more highly doped P type) semiconductor layers. The "drift region" in an LDMOS transistor provides a distinct doping profile between the gate and one source or drain terminal of the transistor. During operation, an LDMOS transistor will provide reliable performance even when an especially high voltage (e.g., five volts or more as in the case of supply voltage VDDIO) is connected to the source or drain.

As shown in the schematic view of FIG. 2, transistors T1, T2 of transistor array 102 are arranged as a "pass gate" in which each of the two transistors is coupled at its gate to a distinct voltage. Transistor T1 is coupled at its gate to the reference voltage VRef output from reference voltage generator 106. Transistor T2 is coupled at its gate to core voltage VDDC, optionally through a control circuit 110, for electrically driving the pass gate transistors T1, T2. Control circuit 110 is shown in dashed lines because it may be omitted, i.e., the gate of transistor T2 may be directly coupled to core voltage VDDC. Control circuit 110 may include one or more electrical couplings such as a resistor, register, one or more additional transistors, etc., to selectively enable or disable the electrical coupling between transistor T2 and core voltage VDDC. The "pass gate" configuration of transistors T1, T2 provides alternate conductive pathways for supply voltage VDDIO to be coupled to the gates of a set of inverting transistors (collectively, "inverter") T4, T5 to be interpreted as comparison voltage VDO_VT. Transistors T4, T5 together define a voltage inverter (i.e., a component for converting an input voltage into an opposite polarity output voltage), that will only operate when a sufficient comparison voltage is applied to the gates of each transistor within inverter T4, T5. Initially, the magnitude of supply voltage VDDIO may not be of significant magnitude to enable current flow through transistor T2. However, supply voltage VDDIO nevertheless may produce reference voltage VRef via reference voltage generator 106 to enable current flow through transistor T1.

The presence of transistor T1 and accompanying gate-to-source voltage differential within the current pathway to inverter T4, T5 may cause the comparison voltage VDO_VT to be different from the magnitude voltage of supply voltage VDDIO. Specifically, T1 operates to increase the magnitude of supply voltage VDDIO in early phases of operation where it may be of too low magnitude to affect inverter T4, T5. After supply voltage VDDIO is of sufficient magnitude to produce core voltage VDDC (and optionally, in cases where control circuit 110 couples core voltage VDDC to transistor T2), a less resistive current pathway through transistor T2 to inverter T4, T5 may be enabled. In this case, the gate-to-source voltage differential will reduce the incoming voltage magnitude such that comparison voltage VDO_VT is lower than supply voltage VDDIO. Thus, the "pass gate" configuration of transistors T1, T2 reduces the magnitude of input voltages that are too high for the operating specifications of inverter T4, T5 and increases the magnitude of input voltages that are too low for the operating specifications of inverter T4, T5.

As also shown in FIG. 1, inverter T4, T5 may couple core voltage VDDC to ground (GND, also known as "VSSC"), such that core voltage VDDC electrically drives the operation of inverter T4, T5. Inverter T4, T5 each may have a predetermined threshold voltage operable to compare a target voltage with comparison voltages output from transistors T1, T2. Optionally, core voltage VDDC may bias the back gates of inverter T4, T5 via the dashed electrical couplings between core voltage VDDC and the back-gate terminals of inverter T4, T5. In situations where supply voltage VDDIO is less than a target voltage, comparison voltage VDO_VT will be insufficient to enable source-drain current flow through inverter T4, T5. In cases where VDDIO is at least equal to the target voltage, comparison voltage VDO_VT will enable current flow through inverter T4, T5.

An output transistor T6 may have a gate terminal coupled to a shared source/drain terminal between inverter T4, T5, such that current flow through inverter T4, T5 will enable a current pathway to GPIO receiver 108 through output transistor T6.

In situations where comparison voltage VDO_VT is not sufficient to enable current flow through comparison transistors T4, T5, a leakage transistor T3 may be coupled to ground at a node between transistors T1, T2 defining the pass gate and inverter T4, T5. Leakage transistor T3 may be coupled to ground GND through its gate, back-gate, and one source/drain terminal. The back-gate terminals of transistors T1, T2, one inverting terminal T5, and output terminal T6 similarly may be coupled to ground GND. In this configuration, inverter T4, T5 and leakage transistor T3 will pull the electrical coupling to reference voltage VRef to ground. As a result, transistor array 102 will selectively ground the electrical coupling to GPIO receiver 108 and will electrically couple reference voltage VRef to GPIO receiver 108 when comparison voltage VDO_VT is sufficient to activate inverter T4, T5. According to an example implementation, the target voltage for comparison voltage VDO_VT may be approximately 0.8 V. In this case, the specified reference voltage may be approximately 1.8 V, and the threshold voltage of inverter T3, T4 may be approximately 0.4 V. During operation, transistors T1, T2 cooperate to provide comparison voltage VDO_VT by linearly reducing the voltage magnitude of supply voltage VDDIO. In this context, the term "linearly" means that the magnitude of VDO_VT may be less than supply voltage VDDIO but may increase or decrease in proportion with the magnitude of VDO_VT.

Figure 3:
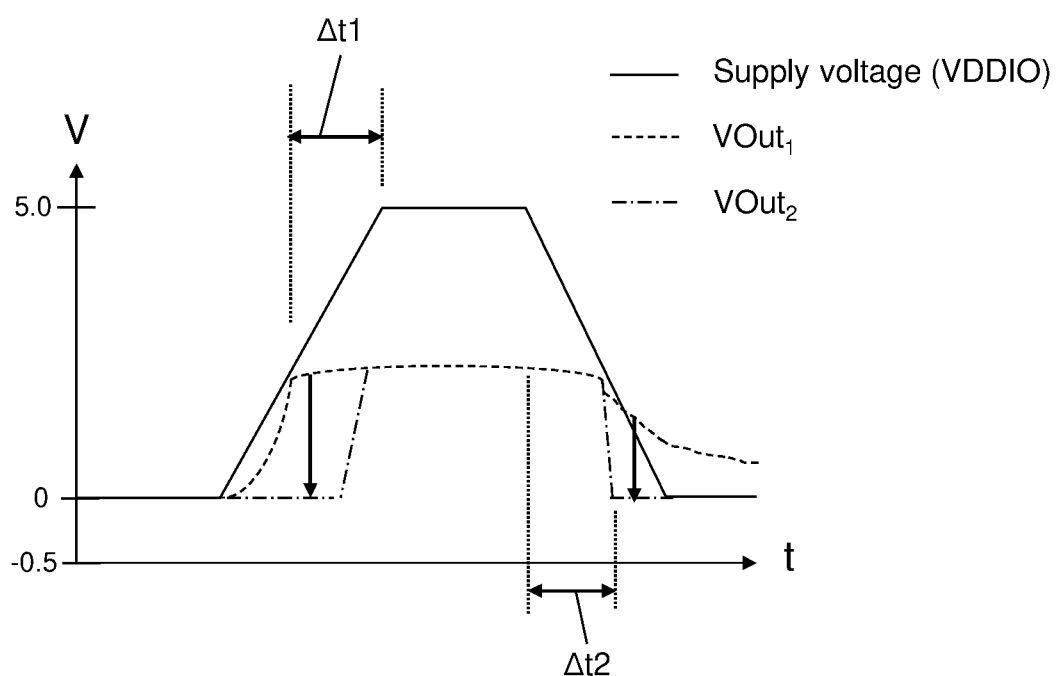
FIG. 3 shows an example plot of voltage versus time for the power supply and reference voltage during operation according to embodiments of the disclosure.

FIG. 3 depicts an example time-dependent voltage profile within structure 100 for supply voltage VDDIO as compared with two output voltage profiles $VOut_1$, $VOut_2$ being transmitted to GPIO receiver 108. The profile of output voltage $Vout_1$ is for a conventional circuit lacking structure 100 and transistor array 102 therein. The profile of output voltage $VOut_2$ is for a circuit including structure 100 and transistor array 102. The output voltage VOut, in either case, is intended to replicate the magnitude of reference voltage VRef from reference voltage generator 106. As a device powers on, supply voltage VDDIO may take more time to fully power on than reference voltage VRef (and hence, output voltage VOut) due to the supply voltage VDDIO being of greater magnitude. FIG. 3 in particular indicates a first delay Δt1 indicating the amount of elapsed time between supply voltage VDDIO and Vout reaching their target values. Similarly, as a device powers off, supply voltage VDDIO may take more time to fully power down than is needed for reference voltage VRef (and hence, output voltage VOut). FIG. 3 indicates a second time delay Δt2 between the power down time for supply voltage VDDIO and reference voltage VRef. In a conventional device, supply voltage VDDIO not fully being powered down will cause reference voltage VRef, and hence output voltage $VOut_1$, to remain at a "floating" voltage level that is above zero volts even after VDDIO reaches a voltage of zero. Embodiments of the disclosure counteract this situation by using transistor array 102 to pull output voltage $VOut_2$ to zero once the target voltage for supply voltage VDDIO is no longer detected. Thus, $VOut_2$ will not remain at a "floating" voltage due to the grounding effects of transistor array 102 within structure 100.

Figure 4:
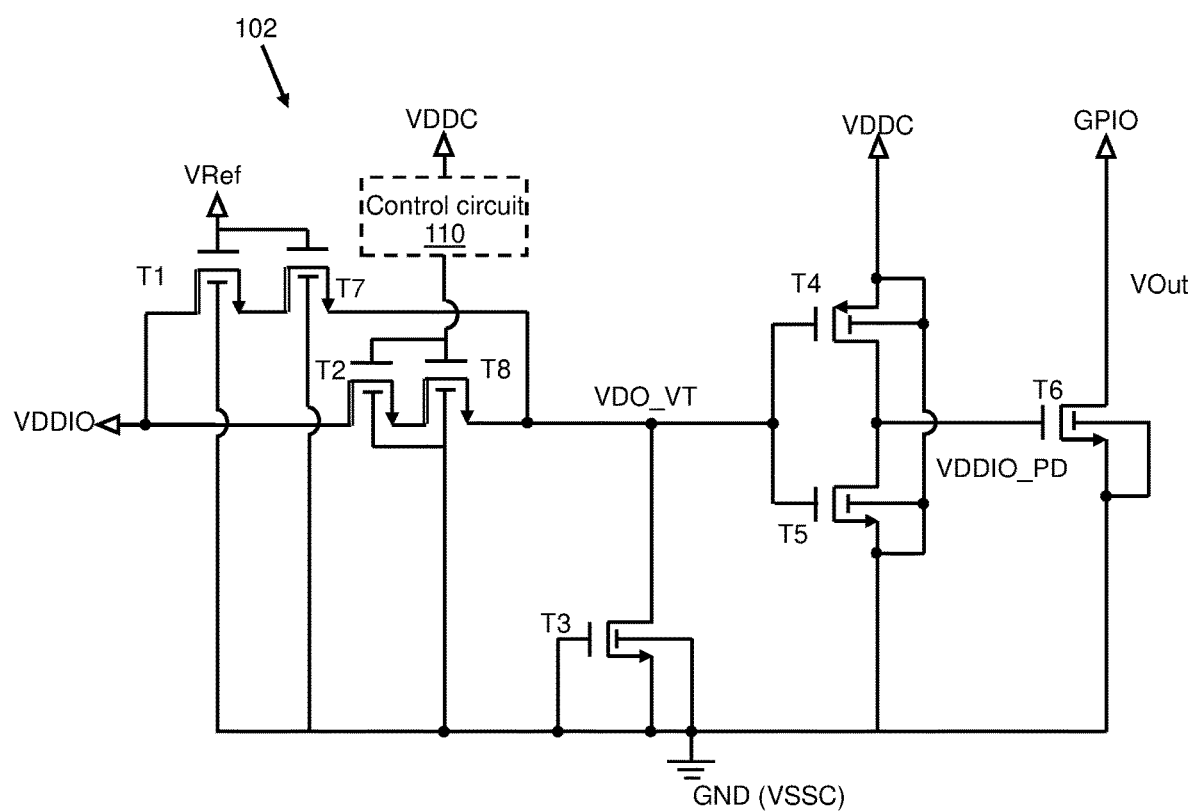
FIG. 4 shows a schematic diagram of a circuit structure according to further embodiments of the disclosure.

FIG. 4 depicts a further configuration of transistor array 102 in embodiments of the disclosure, in which additional LDMOS transistors T7, T8 may be coupled between supply voltage VDDIO and comparison voltage VDO_VT. Transistors T7, T8 may be coupled at their source or drain to a corresponding source or drain terminal of another LDMOS transistor T1, T2, to form a set of serially coupled transistors. Transistors T1, T7 may be coupled at their gates to a shared node, and transistors T2, T8 similarly may be coupled at their gates to a shared node to form "stacked pairs" of LDMOS transistors. Transistor array 102, with transistors T7 and T8 included therein, may be functionally identical to other embodiments of transistor array 102 discussed herein. Although transistors T7, T8 may occupy additional space in structure 100 (FIG. 1), transistors T7, T8 may improve the ability for transistor array 102 to withstand a high magnitude supply voltage VDDIO, e.g., those of at least approximately 5.0 V. Furthermore, it is not necessary for other transistors T3-T6 in transistor array 102 to be implemented as LDMOS transistors in settings where the magnitude of supply voltage VDDIO is high. Thus, a designer or operator of structure 100 may modify the number of LDMOS transistors within transistor array 102 to suit a variety of supply voltage VDDIO magnitudes and/or technical implementations.

Figure 5:
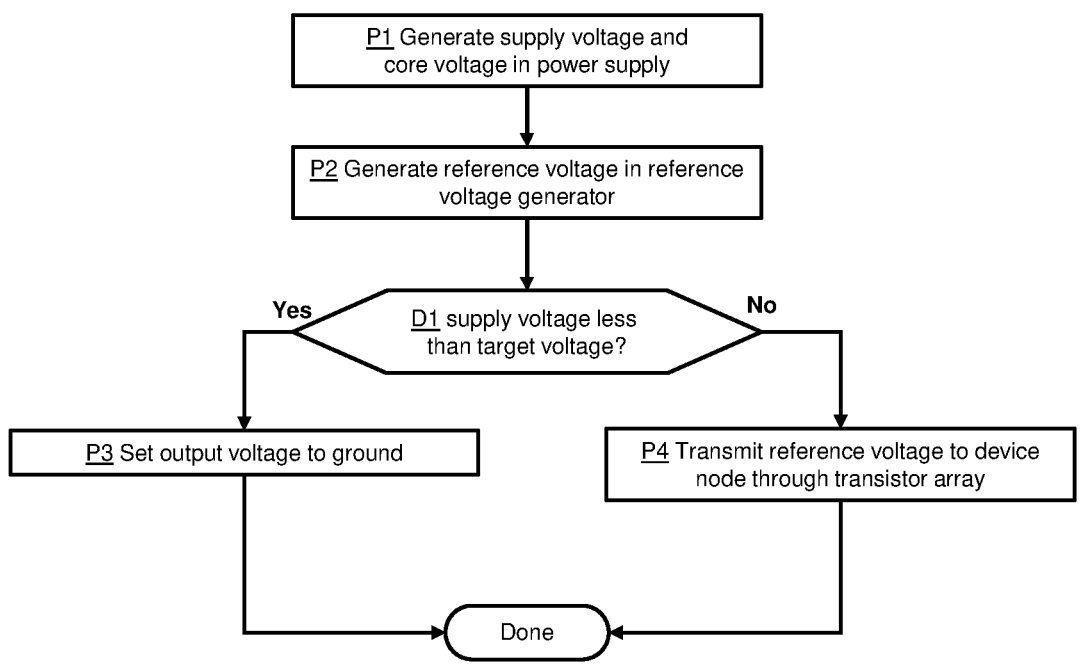
FIG. 5 depicts an illustrative flow diagram for implementing methods according to embodiments of the disclosure.

Turning to FIGS. 1, 2, and 5 together, in which FIG. 5 provides an illustrative flow diagram, further embodiments of the disclosure provide methods of operating a structure 100, including transistor array 102, to ground output voltage VOut in cases where supply voltage VDDIO is less than the target voltage. In an example implementation, the method may include process P1 of generating supply voltage VDDIO (e.g., using power supply 104 (FIG. 1)) and core voltage VDDC (e.g., also using power supply 104 or interconnected circuitry as discussed herein). Supply voltage VDDIO is transmitted to transistor array 102 to be used for comparison with the target voltage, whereas core voltage VDDC is of smaller magnitude for electrically driving one or more of the various transistors T1-T6 within transistor array 102. Process P2 may entail generating reference voltage VRef in reference voltage generator 106, using supply voltage VDDIO for electrically driving reference voltage generator 106 to output reference voltage VRef. In a conventional circuit, reference voltage VRef would be provided directly to GPIO receiver 108 for implementing various functions (e.g., logic gates, etc.). In methods according to the disclosure, however, supply voltage VDDIO and core voltage VDDC generated in process P1, and reference voltage VREF generated in process P2, are provided to transistor array 102 to provide output voltage Vout to GPIO receiver 108.

The function of transistor array 102, in structure 100 and related methods, is to transmit output voltage Vout at the same magnitude as reference voltage VRef when supply voltage VDDIO is not less than the target voltage, or to set output voltage Vout to ground when supply voltage VDDIO is less than the target voltage. Methods of the disclosure thus include decision D1 of detecting (e.g., via inverter T4, T5 of transistor array 102) whether supply voltage VDDIO is less than the target voltage. LDMOS transistors T1, T2 may increase the magnitude of supply voltage VDDIO in early phases of a "powering up" operation or late phases of a "powering down" operation, and conversely may decrease the magnitude of supply voltage VDDIO in late phases of a "powering up" operation or early phases of a "powering down" operation as discussed herein. In either scenario, transistors T1, T2 will output comparison voltage VDO_VT that is less than the breakdown voltage of transistors T4, T5 but high enough to manipulate the gate of transistors T4, T5 based on supply voltage VDDIO being less than or not less than the target voltage. The detecting may include, e.g., transmitting supply voltage VDDIO to each gate terminal of inverter T4, T5 within transistor array 102, in the case where the threshold voltage of inverter T4, T5 corresponds to the target voltage. Here, inverter T4, T5 will turn "on" when supply voltage VDDIO is of high enough magnitude to produce a high enough comparison voltage VDO_VT to activate inverter T4, T5.

In cases where transistor array 102 determines that supply voltage VDDIO is less than the target voltage (i.e., "Yes" at decision D1), the method may continue to process P3 of setting output voltage VOut to ground. The effect of process P3 in structure 100 is to prevent a non-zero floating voltage from being provided to GPIO receiver 108 in the case where supply voltage VDDIO is not sufficient to provide the target voltage. The grounding of output voltage VOut may be implemented via leakage transistor T3 as discussed herein. Specifically, process P3 may include enabling current flow through leakage transistor T3 of transistor array 102, in which the gate terminal, back-gate terminal, a source/drain (S/D) terminal of leakage transistor T3 are all coupled to ground.

In cases where transistor array 102 determines that supply voltage VDDIO is greater than the target voltage (i.e., "No" at decision D1), the method instead may continue to process P4 of transmitting reference voltage VRef to GPIO receiver 108 by setting output voltage VOut to be the same as reference voltage VRef. Output transistor T6 may be coupled at its gate to inverter T4, T5 such that reference voltage VRef is replicated as output voltage VOut through output transistor T6. Regardless of whether process P3 or process P4 is implemented, the method may conclude ("Done") and/or may repeat continuously as power is supplied to structure 100 through power supply 104.

Embodiments of the disclosure may provide several technical advantages, examples of which are discussed herein. In technical applications where power sequencing is required (i.e., multiple voltages of varying magnitude are provided to a device), structure and methods of the disclosure will prevent the lower magnitude voltage from being transmitted to a target node (e.g., a GPIO receiver as discussed herein) until the higher magnitude voltage is available. Similarly, methods and structures of the disclosure will prevent the occurrence of undesirable floating voltages from remaining within a device after powering down a device, e.g., by grounding the node(s) where floating voltages would otherwise occur. Embodiments of the disclosure may provide voltage detection components within a power supply cell of a GPIO component, thus allowing for simple integration of the transistors and/or other components into a device without significant penalty to surface area or power consumption. Embodiments of the disclosure thus avoid the use of more complex voltage detection schemes, e.g., resistor and diode strings, and/or more complex arrays of transistors.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
a pass gate coupled to an input signal and including:
a first transistor including a gate coupled to a reference voltage generator,
a second transistor including a gate coupled to a core voltage configured to drive operation of the pass gate,
wherein an input of the pass gate is coupled to a supply voltage greater than the core voltage; and
an inverter coupling an output from the pass gate to a device node, wherein the inverter includes a drain terminal, a gate terminal, and a back-gate terminal coupled to ground, wherein a threshold voltage of the inverter corresponds to a target voltage, and wherein the pass gate couples an output terminal of the reference voltage generator to ground in response to detecting the input signal as less than the target voltage.

2. The structure of claim 1, wherein the first transistor and the second transistor of the pass gate each include a laterally diffused metal oxide semiconductor (LDMOS) transistor.

3. The structure of claim 1, further comprising an output transistor having a gate terminal coupling the inverter to the device node, wherein a threshold voltage of the output transistor is the target voltage.

4. The structure of claim 1, wherein the reference voltage generator outputs a static reference voltage.

5. The structure of claim 1, further comprising a leakage transistor coupled between the pass gate and the inverter, the leakage transistor including a gate coupled to each back-gate terminal of the pass gate.

6. The structure of claim 1, wherein a threshold voltage of each transistor within the inverter is less than a threshold voltage of each of the pair of transistors within the pass gate.

7. The structure of claim 1, wherein the device node is an internal node of a general purpose input/output (GPIO) receiver.

8. A circuit structure comprising:
a power supply configured to output a supply voltage and a core voltage of less magnitude than the supply voltage;
a reference voltage generator coupled to a power supply and configured to output a reference voltage at an output terminal;
a transistor array coupled to the power supply and the reference voltage generator, wherein the transistor array includes:
a set of LDMOS transistors each having a source/drain (S/D) terminal coupled to the supply voltage; and
an inverter having a gate terminal coupled to the supply voltage through the set of LDMOS transistors, wherein a threshold voltage of the inverter corresponds to a target voltage,
wherein the transistor array couples the output terminal of the reference voltage generator to ground in response to detecting the supply voltage as less than the target voltage, wherein the core voltage drives operation of the transistor array; and
a device node coupled to the output terminal of the reference voltage generator through the transistor array.

9. The circuit structure of claim 8, wherein the set of LDMOS transistors includes:
a first LDMOS transistor having a gate terminal coupled to the output terminal from the reference voltage generator; and
a second LDMOS transistor having a gate terminal coupled to the core voltage from the power supply.

10. The circuit structure of claim 8, wherein the transistor array further includes a leakage transistor coupled between the set of LDMOS transistors and the inverter, the leakage transistor including a gate coupled to each back-gate terminal of the set of LDMOS transistors.

11. The circuit structure of claim 10, further comprising an output transistor having a gate terminal coupled to source and drain terminals of the inverter.

12. The circuit structure of claim 8, wherein the threshold voltage of each of the inverter is less than a threshold voltage of each of the set of LDMOS transistors.

13. The circuit structure of claim 8, wherein the target voltage is approximately 0.8 volts (V), the reference voltage is approximately 1.8 V, the threshold voltage of the inverter is approximately 0.4 V, and the set of LDMOS transistors is configured to linearly reduce the supply voltage.

14. The circuit structure of claim 8, wherein the device node is coupled to an internal node of a general purpose input/output (GPIO) receiver.

15. A method comprising:
transmitting an input signal to a pass gate including:
  a first transistor including a gate coupled to a reference voltage generator,
  a second transistor including a gate coupled to a core voltage configured to drive operation of the pass gate, and
  wherein an input of the pass gate is coupled to a supply voltage greater than the core voltage; and
transmitting an output from the pair of transistors to an inverter including a drain terminal, a gate terminal, and a back-gate terminal coupled to ground, wherein the inverter sets the output from the pair of transistors to ground, wherein a threshold voltage of the inverter corresponds to a target voltage, and wherein the pass gate couples an output terminal of the reference voltage generator to ground in response to detecting the input signal as less than a target voltage.

16. The method of claim 15, further comprising transmitting the reference voltage to the device node through the inverter in response to detecting the input signal as not being less than the target voltage.

17. The method of claim 15, wherein the first transistor and the second inverter of the pass gate includes a set of laterally diffused metal oxide semiconductor (LDMOS) transistors coupled to a supply voltage, wherein the set of LDMOS transistors couples the supply voltage to the gate terminal of the inverter.

18. The method of claim 17, further comprising transmitting the supply voltage to the inverter to detect whether the supply voltage is less than the target voltage.

19. The method of claim 15, wherein setting the output terminal from the pair of transistors to ground includes enabling current flow through a leakage transistor between the pair of transistors and the inverter, the leakage transistor including a gate terminal, a back-gate terminal, and a source/drain (S/D) terminal coupled to ground.

* * * * *